United States Patent
Breme et al.

(10) Patent No.: US 10,552,027 B2
(45) Date of Patent: Feb. 4, 2020

(54) DOMESTIC APPLIANCE HAVING IMPROVED OPERABILITY OF AN OPERATING DEVICE CONSTRUCTED AS A TOUCH SCREEN

(71) Applicant: BSH HAUSGERAETE GMBH, Munich (DE)

(72) Inventors: Jonas Breme, Berlin (DE); Johannes Geyer, Haar (DE); Swetlana Gorodezki, Berlin (DE); Christian Ivanis, Berlin (DE); Hans-Peter Kadel, Berlin (DE); Bastian Koch, Berlin (DE); Manuel Milde, Munich (DE)

(73) Assignee: BSH Hausgeraete GmbH, Munich (DE)

( * ) Notice: Subject to any disclaimer, the term of this patent is extended or adjusted under 35 U.S.C. 154(b) by 71 days.

(21) Appl. No.: 15/756,141

(22) PCT Filed: Aug. 5, 2016

(86) PCT No.: PCT/EP2016/068823
§ 371 (c)(1),
(2) Date: Jul. 30, 2018

(87) PCT Pub. No.: WO2017/036737
PCT Pub. Date: Mar. 9, 2017

(65) Prior Publication Data
US 2018/0349009 A1    Dec. 6, 2018

(30) Foreign Application Priority Data

Aug. 31, 2015    (DE) .................. 10 2015 216 628

(51) Int. Cl.
*G06F 3/0484*    (2013.01)
*G06F 3/044*    (2006.01)
(Continued)

(52) U.S. Cl.
CPC ........ *G06F 3/04847* (2013.01); *D06F 29/005* (2013.01); *D06F 58/28* (2013.01);
(Continued)

(58) Field of Classification Search
CPC . G06F 3/04847; A47L 15/4293; D06F 29/005
See application file for complete search history.

(56) References Cited

U.S. PATENT DOCUMENTS 4,204,204 A * 5/1980 Pitstick ................... F24C 7/087
                                                          341/20
9,235,306 B2 1/2016 Lubert et al.
(Continued)

FOREIGN PATENT DOCUMENTS

DE    102011077902 A1    12/2012
DE    102011081331 A1    2/2013
(Continued)

*Primary Examiner* — Chun-Nan Lin
(74) *Attorney, Agent, or Firm* — Laurence A. Greenberg; Werner H. Stemer; Ralph E. Locher

(57) ABSTRACT

A domestic appliance for treating objects includes a control device and an operating device being an external or internal touch screen. The control device displays a display field within a screen display having an operating element and a display element setting and displaying a control variable of the appliance settable by touch. The operating element contains a sensor element having segments. A lowest value of the control variable or an OFF function deactivating the control variable is associated with a first segment and different values of the control variable are associated with further segments. The control device displays at least two display elements after and/or simultaneously with touching the sensor element. The first display element displays lowest settable value of the control variable or OFF function and the
(Continued)

second display element displays highest settable value of the control variable. A method for operating the appliance is also provided.

15 Claims, 3 Drawing Sheets

(51) Int. Cl.
    *H03K 17/96* (2006.01)
    *D06F 29/00* (2006.01)
    *D06F 58/28* (2006.01)
    *G06F 3/0488* (2013.01)
    *H05B 37/02* (2006.01)
    *A47L 15/42* (2006.01)
    *D06F 39/00* (2006.01)
    *G06F 3/16* (2006.01)
    *G09G 5/10* (2006.01)

(52) U.S. Cl.
    CPC .......... *G06F 3/044* (2013.01); *G06F 3/04886* (2013.01); *H03K 17/9622* (2013.01); *H05B 37/0218* (2013.01); *A47L 15/4293* (2013.01); *D06F 39/005* (2013.01); *D06F 2058/2803* (2013.01); *G06F 3/167* (2013.01); *G09G 5/10* (2013.01); *G09G 2354/00* (2013.01); *G09G 2360/144* (2013.01)

(56) References Cited

U.S. PATENT DOCUMENTS

| | | | |
|---|---|---|---|
| 9,611,579 | B2 | 4/2017 | Brasseur et al. |
| 2008/0235614 | A1 | 9/2008 | Ricklefs et al. |
| 2009/0237381 | A1 | 9/2009 | Otani et al. |
| 2011/0062143 | A1* | 3/2011 | Satanek ................ F24C 7/085 219/489 |
| 2013/0092033 | A1 | 4/2013 | Murphy et al. |
| 2015/0013074 | A1* | 1/2015 | Ficke ..................... D06F 33/02 8/137 |
| 2015/0345068 | A1 | 12/2015 | Coffman et al. |

FOREIGN PATENT DOCUMENTS

| | | |
|---|---|---|
| DE | 102012223779 A1 | 6/2014 |
| EP | 2392859 A1 | 12/2011 |
| RU | 2013119903 A | 11/2014 |
| RU | 2013157509 A | 7/2015 |
| WO | 2012118285 A2 | 9/2012 |
| WO | 2012175523 A1 | 12/2012 |
| WO | 2013026734 A1 | 2/2013 |
| WO | 2014124105 A2 | 8/2014 |

* cited by examiner

DOMESTIC APPLIANCE HAVING IMPROVED OPERABILITY OF AN OPERATING DEVICE CONSTRUCTED AS A TOUCH SCREEN

BACKGROUND OF THE INVENTION

Field of the Invention

The invention relates to a domestic appliance having an operating device constructed as an external or internal touch screen. The invention relates, in particular, to a domestic appliance for treating objects, having a control device and an operating device constructed as an external or internal touch screen, the control device being configured to display a display field on at least a part of the touch screen within a screen display, in which display field at least one operating element and at least one display element for setting and displaying a control variable of the domestic appliance settable by touch are arranged. The invention also relates to a method for operating such a domestic appliance.

For operating numerous devices such as computers and smartphones, in recent years, it has become increasingly popular to use a touch-sensitive operating device. Such a touch-sensitive operating device which combines a display device with an operating unit and is hereinafter designated a "touchscreen", in principle, enables a pleasant and rapid operation of the device in question.

Domestic appliances with a touch screen are now also known.

DE 10 2011 081 331 A1 and WO 2013/026734 A1 disclose a domestic appliance with a touch-sensitive operating and display device which has a display unit for displaying operating information and a transparent support part on which at least one capacitive sensor electrode is arranged as a part of a touch capacitor which is arranged overlapping with the display unit and overlapping with a touch-sensitive actuating surface of the operating and display device, the at least one sensor electrode being constructed from a transparent and electrically conductive paint and/or adhesive which contains, in particular, nanotubes made of carbon.

DE 10 2011 077 902 A1 discloses a capacitive operating and display device for a domestic appliance, having a display window with a touch-sensitive operating area, a display symbol being applied to the display window, with at least one illuminating element for outputting light for backlighting the display symbol, and with a capacitive sensor electrode as part of a touch capacitor, which are arranged at a spacing from the operating area, so that when the operating area is touched, a capacitance of the touch capacitor is changeable, wherein the sensor electrode is arranged on a circuit board and arranged between the operating area and the sensor electrode is an element which is made of an elastic, electrically insulating material.

DE 10 2012 223 779 A1 discloses a domestic appliance with a control device, an at least partially translucent cover and an at least partially translucent operating panel with at least one capacitive sensor for selecting a program function of the domestic appliance by a user of the device, the operating panel having a plastics component consisting of a plurality of layers, comprising (a) a display film; (b) a touch-sensitive film which has the at least one capacitive sensor and electrical conductor tracks; and (c) a structured light guide layer; the plastics component being obtainable by connecting a self-adhesive display film to the touch-sensitive film and a subsequent back injection-molding of the structured light guide layer.

WO 2012/175523 A1 discloses an operating and display device for a domestic appliance, capacitive sensor electrodes being arranged overlapping with the touch-sensitive actuating area and assigned to each of at least part of function symbols, which are associated with a value of a parameter of an operating process of the domestic appliance, is assigned a separate capacitive sensor electrode which is arranged overlapping with the function symbol associated therewith, so that by touching the actuating area in an overlapping region with one of the sensor electrodes, a capacitance of a touch capacitor having this sensor electrode is changeable.

The control of a domestic appliance by means of a touch screen can be very difficult if the number of executable programs and setting possibilities of parameters is very large. This applies, in particular, for domestic appliances for treating articles such as laundry, crockery/cutlery and foods. In a complex hierarchy of programs and setting possibilities, a user of the domestic appliance can easily be overextended and lose the overview of the control system. This is the case, above all, if for particular program steps there are also many individual setting possibilities. However, it is precisely the possibility of inputting optimum settings that can permit a very efficient and convenient operation of a domestic appliance. Aside from a more economical operation of the domestic appliance with regard to the use of energy and consumable materials such as water, cleaning agents, etc., the operation can also be configured as particularly user-friendly if the input of optimum settings is possible.

However, the size of the touch screen restricts the range of movements that can be used for setting parameters, as well as the number of parameters that can be set using a touch screen. This often requires a deep hierarchy of menus and windows for setting parameters that are to be used for a program to be carried out in the domestic appliance. However, this delays the control of a program or, in the case of a perhaps not very patient user, non-optimized procedures are specified, so that the operation of the domestic appliance does not take place optimally. An improved, simplified operation of domestic appliances constructed for the utilization of the whole program and option portfolio is therefore desirable.

US 2011/062143 A1 discloses a cooking appliance with a touch-sensitive control display which is adapted to display an interactive cooking time delay screen, comprising a first virtual "slide bar", which is adapted to be positioned by a user along a first virtual track, the first virtual track constituting a time axis, containing time information at intervals spaced from one another along the first virtual track. Herein, the first virtual slide bar has a length which corresponds to a total time of a cooking cycle with a start time and a stop time, so that the displacement of the first virtual slide bar along the first virtual track simultaneously sets the start time and the stop time of the cooking cycle and enables the user to delay the cooking until a selected start time; and a control unit in communication with the user interface for regulating the operation of the cooking appliance based upon the positioning of the first virtual slide bar along the first virtual track. The control display is also adapted to set a screen for the temperature selection and a screen for the selection of a desired duration of the cooking cycle, wherein for the setting, a slide bar is provided in each case, wherein the slide bar appears to contain individual segments.

US 2013/092033 A1 discloses an oven comprising a cooking chamber that is configured to receive a food product; a user interface that is configured to display information relating to methods for cooking the food product; and a cooking regulating device which is operatively connected to the user interface in order to control the display of cooking parameter input pages to enable the user to define and set cooking parameters, each of the input pages shown containing a selection indicator band that shows graphical elements which correspond to each of the cooking parameters input through preceding pages. In FIG. 16, a slide bar for setting a temperature is shown, wherein apart from the display of the word "Temperature" and a surface 640 for selecting application options via the slide bar, the start value and the end value of the temperature are shown. Furthermore, a temperature value evidently corresponding to a selected position on the slide bar is displayed enlarged. Similar slide bars are described for the setting of a convection time and a fan speed.

U.S. Pat. No. 4,204,204 discloses on-off switch arrangements for a "touch control bar graph device" which comprises, inter alia: a touch-sensitive "ON" area which is arranged in the vicinity of the touch control bar graph device, but spatially separate therefrom; and a switching-off, touch-sensitive area between the "ON" area and the touch control bar graph device; wherein every attempt by a user to effect the operation of this bar graph device by a direct movement of a finger from the "ON" area to the bar graph device leads to a switching off of the bar graph device. This is intended to increase the reliability of the operation.

SUMMARY OF THE INVENTION

Against this background, it was an object of the present invention to provide a domestic appliance for treating objects which has improved operability. Preferably, the complexity of the information output to a user should also be reduced and thus a more transparent and therefore error-reduced operation enabled. Furthermore, a method for operating this domestic appliance is to be provided.

The achievement of this object is obtained according to this invention by means of a domestic appliance for treating objects (hereinafter also abbreviated to "domestic appliance") and a method suitable for its operation having the features of the corresponding independent claims. Preferred embodiments of the domestic appliance according to the invention are disclosed in the corresponding dependent claims. Preferred embodiments of the domestic appliance according to the invention correspond to preferred embodiments of the method according to the invention and vice versa, even if not explicitly disclosed herein.

The subject matter of the invention is thus a domestic appliance for treating objects, having a control device and an operating device constructed as an external or internal touch screen, the control device being configured to display a display field on at least a part of the touch screen within a screen display, also designatable a "window" in which at least one operating element and at least one display element for setting and displaying a control variable of the domestic appliance settable by touch are arranged, wherein
(a) the at least one operating element contains an elongate, flat sensor element with a first segment and at least two further segments, wherein associated with the first segment is a lowest value of the settable control variable or an OFF function for deactivating the control variable and different values of the settable control variable are associated with each of the at least two further segments; and
(b) the control device is configured to display at least two display elements after and/or simultaneously with a touching of the sensor element, the first display element displaying the lowest settable value of the control variable or the OFF function and the second display element displaying the highest settable value of the control variable and wherein between the first segment and the further segments, a larger spacing exists than between the further segments.

The expressions "display element" and "operating element" are to be interpreted broadly. By means of both elements, in general, an item of information can be made available to a user. However, here the expression "display element" signifies, in particular, an element which enables only a display of information, but no input by the user. This contrasts with the expression "operating element" which relates to an element which not only enables the display of information, but with which an input by a user can also be made. Operating elements have, for this purpose in particular, touch switches (also known herein as "sensor elements").

According to the invention, at least one operating element is an elongate, flat sensor element. This can be realized, for example, in the form of a bar. The dimensions and the form of the bar are not restricted according to the invention. It may, for example, be a narrow long square-edged design, but also a broad, rounded design or, equally, it may have an irregular form. The elongate, flat sensor element preferably has at least three segments. The manner of representation of the three segments is herein not restricted according to the invention. For a user, they can be presented visually perceptible or visually imperceptible. A visually perceptible presentation can be, for example, a subdivision of the elongate, flat sensor element by means of vertical lines and/or regions. Equally, a different coloration is also conceivable, wherein coloration according to the invention covers all colors as well as black, white and gray levels, a different shape and/or a different design, wherein according to the invention, design includes graphical and haptic patterns.

With regard to the physical principle, the type of the touch switch is not restricted. Preferably, however, capacitive touch switches or operating elements are used. In any case by means of such an operating element, an input for setting a control variable of the domestic appliance by a user can be undertaken.

Further operating elements can also be present, the design of the further operating elements and/or display elements otherwise not being restricted according to the invention. The configuration is determined in general by the information to be displayed. Otherwise, operating elements and/or display elements can have any form. An element can be, for example, rectangular or round, but can also assume more complex forms.

In the inventive domestic appliance, between the first segment and the further segments, in the elongate, flat sensor element, a relatively larger spacing exists than between the other segments. Since a lowest value of the settable control variable or an OFF function for deactivating the settable control variable is associated with the first segment, with this embodiment, an easier and quicker operation of the domestic appliance is possible. The size of the spacing and the relative positioning of the first segment in relation to the further segments are herein not restricted according to the invention. Preferably, however, the first segment is shown in front of the further segments in the horizontal direction. A visually imperceptible representation of the typically at least three segments is a continuous representation according to the invention, which appears, for example, as an uninterrupted bar. The shape of the segments is also not limited according to the invention. All the, for example, three segments can have the same shape, although the shapes can also differ from one another. Thus, for example, the first segment can be configured circular and the other segments can be rectangular, although all the segments can also be rectangular. Complex shapes of the segments are also conceivable, for example, a star shape.

The expression "touch" should be interpreted broadly in that it includes all touches with an external input unit which can be converted into an electrical signal, also designatable a "touch signal". According to the invention, an external input unit can be, for example, the finger of a user and/or also a stylus. Accordingly, a touch can be carried out quite generally with an input unit. The external input unit serves to generate touch signals on the touch screen, touch signals usually covering movements such as pressing, pulling, wiping and/or rotating.

The expression "settable control variable" should be interpreted broadly. According to the invention, settable control variables of a domestic appliance include treatment programs, program parameters and/or additional options which are provided for the operation of a domestic appliance, provided that a lowest value of the settable control variable or an OFF function for deactivating the control variable can be associated with the first segment and different values of the settable control variable can be associated with each of the at least two further segments. The number of such control variables can vary depending upon the type and technical equipment of the domestic appliance. According to the invention, a settable control variable generally comprises at least three values. Thus, a treatment program can comprise, for example, a plurality of program parameters, for example, in a domestic appliance which is configured as a washing machine, the program parameters of temperature, spin and time. A program parameter such as, for example, the temperature can likewise have a plurality of values, for example, cold, 30° C., 40° C., 60° C. and 90° C. In any event, a settable control variable in a domestic appliance preferably has three selectable values for setting.

According to the invention, the manner of the setting of the settable control variables is not further restricted. This can involve the selection of program parameters of a treatment program or the modification of default values previously stored in the control device, said default values typically being stored for standard programs. However, this can also involve a user-defined setting or the setting of additional options. An additional option can be, for example, an additional rinsing process in a washing machine or a delayed start of a program sequence or a program sequence configured for the fulfillment of other stipulations in a washing machine such as rapidity, for example, a washing program executing as quickly as possible, or a washing program configured for energy efficiency, a hygiene step or, for example, also a washing program adapted to an individual level of soiling, such as for instance, blueberry or red wine stains.

According to the invention, settable control variables can be set by a user by touching the operating elements. According to the invention, at least one operating element is an elongate, flat sensor element which has at least three segments. If the settable control variable has, in particular, a value scale of at least three values, such an operating element is advantageous. If a settable control variable is set by touching an elongate, flat sensor element, then preferably a value on the value scale or a function is associated with each of the segments of the sensor elements through the control unit, whereby herein preferably the lowest value and/or the OFF function of the settable control variable are associated with the first sensor element. "OFF function" here means the switching off of the settable control variable. Depending upon the type of touch, the value of the settable control variable can change continuously or in jumps. In principle herein, there are two possibilities for its use. In a first possibility, a substantially locally fixed touching with an external input unit, in particular with a finger, that is, particularly not a pulling or laterally proceeding movement, can be evaluated as a point-type touching of the control unit. In general, a particular value is then associated with the location of the point-type actuation, which value is thereby set. In the second possibility, it is provided that for actuation, an external input unit, in particular a finger, is applied and, above all, is moved in a pulling movement along the elongate sensor element. This actuation therefore goes beyond a point-type touching. Depending upon the length and/or the starting point and end point of the actuation or the pulling elongate movement, a corresponding value is set.

In one embodiment of the inventive domestic appliance, it is further preferred that in the control device dependencies between settable control variables are stored which prevent an input of combinations or other inputs by a user that are disadvantageous or even lead to damage. The input is herein preferably blocked by the control device. Thus, for example, in the case that the domestic appliance is a cooking device and the cooking of the foodstuff potato has been selected by a user, the input of a running time of 3 h can be blocked.

According to the invention, the representation of at least two display elements within a display field is possible. Display elements serve to provide information to a user. The manner of the representation and the content of the information are herein not restricted according to the invention. In any event, the representation of the display elements serves to support the setting of the control variable by means of the operating elements. The display elements herein preferably represent a lowest and a highest value as well as a currently set value of the value scale of a settable control variable. In this way, a user receives guidance regarding what range of values is available for setting a control variable. This is particularly significant if the setting of particular values is blocked due to a disadvantageous and/or damage-causing combination which is stored in the control device.

As a rule, the time-dependent representation of display elements is not restricted according to the invention. Display elements can either be represented permanently on the display field or, for example, with a time delay. The representation of display elements can, however, also be triggered by a touch signal. According to the invention, it is herein preferred, in particular, if display elements for displaying the lowest and uppermost values of the value scale of a settable control variable are displayed on an operating element, simultaneously with or immediately following, a first touch signal. In this way, the complexity of a representation of elements on a display field can be reduced and only the items of information that are important for a user at an operating time point are displayed.

Furthermore, more than one operating element can be arranged in a display field so that a plurality of control variables can be set via one display field. Finally, the operating elements can also be arranged in a plurality of display fields of a screen view.

The representation of settable control variables on the touch screen is realized, according to the invention, in general by a representation of operating elements and/or display elements in the form of text, comprising letters, numerals and special characters and/or an image. Advantageous is also a representation in the form of an animation. The expression "animation" is broadly defined herein and is not precisely restricted. According to the invention, it comprises all types of dynamic representations, for example, simple blink sequences, moving patterns, images and/or texts, but also for example, video sequences.

The manner of the images and animations for representing settable control variables is not restricted according to the invention. They can involve, for example, abstract and/or realistic representations which can be context-related, that is, for example, to a particular program parameter. They can also be context-unrelated, that is for example, serving only for differentiation. A user-specific representation and/or color selection is also possible. In one embodiment of the inventive domestic appliance, for this purpose, representation packages with different layouts for the touch screen are stored in the control device and can be selected as preferred by a user.

In embodiments of the inventive domestic appliance, in the case, for example of a washing machine, the setting of the program parameter temperature for washing cotton laundry items can be represented for a user on the touch screen both by the expressions cotton and temperature and also by an image of a cotton plant in conjunction with an image of a thermometer. However, the representation of a combination of image and text is also possible. An animated image presentation is also possible.

In a further preferred embodiment of the inventive domestic appliance, a switching-on process, a switching-off process and/or a stand-by mode of the domestic appliance can be output in the form of text, image and/or animation to a user via the touch screen. Thus, for example, the expression "Hello" can appear at the switching-on process and the expression "Goodbye" at the switching-off process and/or the expression "Pause" in stand-by mode. However, the display can also be configured in an image representation. Thus, the company logo can appear at the switching-on process and/or disappear at the switching-off process. It is also possible that video sequences are shown which impart to a user, for example, a welcome, a sign-off and/or a stand-by situation.

In general, operating elements and display elements have a different validity for a user depending upon a time point. "Validity" herein means the level of importance of the information. Thus, for example, in a domestic appliance that is configured as a washing machine, when a temperature is set, the display element Temperature has a high validity G1, whereas the display element Spin has a lower validity G2. According to the invention, it is therefore preferred to display for a user elements with a high validity G1 as emphasized and to display for a user elements with a lower validity G2 as suppressed and/or to fade them out.

The manner of representation is herein not restricted according to the invention. It can be carried out in black-and-white, in a gray levels and/or colored. In particular, the representation can preferably also have a color logic. Thus, for example, operating and/or display elements with a higher validity G1 can be displayed emphasized in high contrast and/or in a first color and operating and/or display elements with a lower validity G2 can be displayed suppressed in low contrast and/or in a second color. A change to the form of an operating and/or display element, depending upon the validity for a user is also possible, preferably elements with a lower validity G2 being displayed with a lower width and/or height. In this way, an improved overview is provided and it is easily possible for a user to grasp important information visually at a particular operating time point.

Such a representation package for the touch screen comprises for example colors, black, white and blue, as well as different gray levels. The touch screen background for an overview representation can be, for example, black and for an area in which a setting takes place, for example, a temperature setting, white. Texts can be displayed, depending upon the validity of the operating and/or display element, emphasized in white and/or black for G1 and/or suppressed in gray for G2. Thus, for example, already selected program parameters can be represented in white and/or black and not selected and/or non-selectable parameters in gray. Image representations and animations can also be represented in blue and/or white. Thus, for example, for a domestic appliance for treating laundry items, supporting the text regarding run time, an image of a clock can be shown in blue.

In a further preferred embodiment, the control device is also configured so that the selection and setting of settable control variables is displayed by means of acoustic and/or optical signals.

Thus, an inventive preferred domestic appliance has a sound generator and a loudspeaker for generating and reproducing acoustic signals in relation to the setting of the settable control variables. Furthermore, on a touch screen an acoustic impression, for example, the pressing of a button can be conveyed with a sound in combination with a touch.

The manner, the design of the loudspeaker and its mounting location are herein not restricted according to the invention. It can be applied visibly for a user or can be integrated into the domestic appliance, invisible for a user. Also stored in the control device of the domestic appliance are at least one sound and/or sound sequences which are associated with a touch signal, a switching-on/off process or a change between two screen representations. Thus, for example, on touching of an operating element by a user, a sound which communicates the pressing of a button can be output simultaneously by the control device. In particular, in a further embodiment of the inventive domestic appliance, it is preferred that in the control device, sound sequences are also associated with a touch signal, a switching-on/off process or a change between two screen representations. Thus, for example, a switching-on process and/or a switching-off process can be communicated acoustically to a user by an associated sound and/or a sound sequence.

In preferred embodiments of the invention, the touch screen is configured to convey a haptic effect on touching. This can be achieved, for example, through vibration in combination with a touch signal and/or a suitable surface modification, e.g. a haptic impression can be imparted via depressions such as grooves or round depressions which are adapted to the size of a finger. The type and intensity of the haptic effect can be dependent on a program parameter and parameter value associated with an input area. Since furthermore in embodiments of the invention, further input areas can be provided, e.g. an on/off switch, special haptic properties can also be associated with these.

In a preferred embodiment of the inventive domestic appliance, the operating device of the domestic appliance can therefore additionally be configured to generate vibrations. In the control device, for example, a vibration signal or vibration sequences can be stored which are associated with particular touches. Thus, for example, in the case of a touch signal in the form of touching or pressing on the touch screen, the control device can initiate a vibration which imparts the impression of a key press to a user.

In a preferred embodiment of the domestic appliance, combinations of an optical, acoustic and haptic representation of program parameters and parameter values by means of the touch screen are also possible.

In general, the number of settable control variables is large, in particular, in a water-using domestic appliance. As a rule, an operating device constructed as a touch screen limits the region in which the treatment programs and parameter values can be represented clearly.

According to the invention, operating elements and/or display elements are shown at least within a display field. The display field herein preferably occupies a part of the touch screen. However, it can also extend over the whole area of the touch screen. The proportion of the touch screen area and the design and form of the display field are not restricted according to the invention. As a rule, the proportion of the touch screen that the display field occupies is larger if a larger number of information items must be provided. Similarly, the proportion of the touch screen area that the display field occupies becomes larger if the display field has a higher hierarchy. "Hierarchy" in the sense of the invention herein particularly means the sequence of the arrangement of display fields and screen displays. For example, on starting of a domestic appliance, the first screen display shown initially has a high hierarchy level. Second and subsequent screen displays which are shown from the first display, that is, can be opened therefrom, have a lower hierarchy level. A screen display typically comprises one or more display fields.

Screen displays and also, in particular, display fields can follow directly one after another, i.e. without a further screen display or a further display field being interposed, or indirectly, i.e. with one or more interposed screen displays or display fields. A plurality of display fields can be shown simultaneously on a touch screen. The design of the display fields is herein not restricted according to the invention. In general, it is determined by the information to be displayed. Thus, for example, a representation of standard programs is displayed, as a rule, in the form of a list with evenly distributed area portions. On more exact determination of a treatment program or program parameter selected by a user, such as the setting of a temperature, the area division is preferably weighted in favor of these display fields. I.e. the area associated with this display field in which, for example, the temperature and its setting capabilities are generally represented by the largest percentage proportion in order enable the greatest possible transparency, and easy operation for a user. Accordingly, other display fields which are not touched by a user for a setting are displayed in a smaller area portion and/or faded out.

In general, a change from a screen display or a display field to a second screen display or a second display field and/or a navigation within a screen display or a display field can take place continuously and/or in jumps. In one embodiment of the invention, it is herein preferred that the control device of the domestic appliance is configured to enable such a change by touching a part of an operating element provided therefor.

In general, a change from one display field to a second display field and/or a navigation within a display field can take place continuously and/or in jumps.

The control device is preferably also constructed to enable the direct start of a treatment program in that a subregion of an operating element provided herefor is touched.

Furthermore, a domestic appliance is preferred in which the control device is additionally configured to enable the change between a screen display B1 and a screen display B2 in that a subregion of an operating element provided herefor is touched.

In general, by touches on the touch screen, a user can select and/or user-define settable control variables. In a preferred embodiment of the inventive domestic appliance, the control device therefore has a data store in which user-defined settings are stored and can be recalled again for renewed execution in the domestic appliance. For this purpose, following the setting a user can, for example, touch an operating element with an image in the form of a star and/or a storage medium which represents the function "Save in Favorites". The representation can also be animated.

The touch screen can be realized by different means, provided that a touch can suitably be converted into electrical signals. In particular, the style and construction of the touch screen is not restricted according to the invention. Any touch screen that is suitable for reproducing information in the form of text, images and/or animation and to convert touches into signals can be used.

Preferably, the touch screen comprises a display with a display screen with a cover panel and a touch film arranged between the display and the cover panel. According to the invention, the touch screen is also touch-sensitive in at least two directions. An operating element can be constructed touch-sensitive overall or only in subregions. Furthermore, an operating element can be subdivided into a plurality of independent touch-sensitive sub-areas. By this means, it is for example possible, by touching a first operating element that is associated with a treatment program, to start the treatment program directly when a first sub-area is touched, or to modify the treatment program with regard to program parameters if a second sub-area is touched and thereby a further display field is shown.

The type of display on the touch screen of the domestic appliance is not limited according to the invention. For example, an LCD, LED, OLED or AMOLED display can be used. In this way, operating elements or subregions thereof can be represented visually emphasized through a targeted back-lighting and/or another coloration, wherein "visually emphasized" means a particularly high contrast relative to the display background and "visually suppressed" means a particularly low contrast relative to the display background.

The material and design of an optionally used cover panel are also not restricted according to the invention. In a preferred embodiment of the inventive domestic appliance, however, a cover panel made of acrylic glass is used. Plastics such as acrylic glass have the advantage, in particular, as compared with glass for example, of being more easily formable so that touch screens can also be manufactured with a shape deviating from a flat form, for example, curved concave or convex. Preferably, the acrylic glass cover panel is herein constructed tinted, particularly preferably tinted black. In this way, the transparency of the panel can be adapted so that components of the touch screen lying thereunder that are not to be visible are not visible to a user. In embodiments of the inventive domestic appliance, the cover panel can also exceed the dimensions of the touch screen in the height and/or width. In this way, an acrylic glass operating panel with integrated touch screen can be achieved.

The touch film is also not restricted according to the invention, provided it can convert touches of an external input unit into signals which can be processed by the control device for controlling the domestic appliance.

However, it is preferred that as operating elements, touch switches on a capacitive basis are used which have capacitive sensor elements. In particular, the elongate, flat sensor element is preferably a capacitive sensor element.

In a preferred embodiment of the inventive domestic appliance, the touch film is therefore a capacitive touch film. The capacitive touch film herein preferably comprises at least one sensor electrode which through proximity and/or touching by an external input unit, can generate an electrical signal evoked by changes to the electrical capacitance. Particularly preferably, the touch film has a grid of sensor electrodes. Typically situated between the sensor electrodes is an insulating material, a dielectric. The capacitance at the crossing points of the sensor electrodes is generally detected by a circuit. According to the invention, the grid of electrodes can be formed through the application of a structured, electrically conductive material. The structuring can have many forms from simple geometrical forms such as circles, rectangles, etc. to complex irregular forms, but also lines in the X and Y-directions are possible. The electrically conductive material is preferably transparent, for example, indium tin oxide (ITO). Particularly preferably, however, transparent and conductive lacquers and/or adhesives can be used. The latter have the advantage, in particular, of a simpler application onto shaped surfaces, for example, convex or concave surfaces, without sacrifices in the functionality. In addition, conductive paints and/or adhesives are often more economical.

Electrically conductive layers such as sensor electrodes or circuits are generally created by sputtering or silkscreen printing.

The touch film is typically connected to evaluating electronics which is necessary in order to detect an electrical signal evoked by changes in the electrical capacitance as a result of a proximity and/or touching of sensor electrodes by an external input unit. The expression "evaluating electronics" generally covers electronic components, conductor track structures, solder connections and possibly further components. The evaluating electronics is generally connected to the control device of the domestic appliance.

According to the invention, the touch film is preferably flexibly constructed, can also be transparent and is preferably made from a plastics material. It can be constructed single or multi-layered and glued onto the cover panel or back-molded directly by means of injection molding or compression injection molding. In one embodiment of the inventive domestic appliance, the at least one sensor electrode or the grid of sensor electrodes is arranged on the film and the at least one sensor electrode or the grid of sensor electrodes can be arranged either on the side facing toward the cover panel or the side facing away from it.

The arrangement of the touch screen on the domestic appliance is not particularly restricted. Preferably, however, the touch screen is applied in an angle of 10° to 45° relative to a vertical axis on a basic surface of the domestic appliance.

The operating device constructed as a touch screen can be integrated into an operating panel of the domestic appliance. The design of the operating panel is herein not restricted according to the invention and can vary depending on the configuration of the domestic appliance. Preferably, the operating panel is at least partially transparent, particularly preferably, the operating panel is made of, for example, black acrylic glass, but can also be colored. In a further preferred embodiment of the domestic appliance, the operating panel is also arranged inclined relative to the housing of the domestic appliance, and preferably this inclination is 10° to 45°, particularly preferably 25°. In this way, in particular with free-standing domestic appliances, the touch screen can be easily operated by a user since a user can very readily recognize the representation on the touch screen from a standing, unbent posture. Furthermore, dazzling of the user by reflected light can also be reduced.

In a particularly preferred embodiment of the invention, the operating device is constructed as an external touch screen, i.e. in particular as an external mobile user terminal. Particularly preferably, a tablet computer, smartphone or other mobile user terminal device configured for controlling the domestic appliance is used as a touch screen. Touch screens are generally also used in smartphones and tablet computers. In a further preferred embodiment of the inventive domestic appliance, the operating device configured as a touch screen is therefore integrated into a mobile external user terminal device, for which purpose typically a particular item of operating software must be present in the external user terminal device. The type of the user terminal device is not restricted according to the invention, provided it is capable of the external communication of data.

In this way, a user is enabled, for example, to operate a water-using domestic appliance and/or to monitor its operation externally, so that he does not have to remain at the location of the domestic appliance for this. If the water-using domestic appliance has a dosing system for treatment agents, then in one embodiment, for example, the supply quantity of treatment agent in the dosing system can also be requested by a user via the mobile user terminal device. For this purpose, a suitable display element can be displayed on one or more display fields on the touch screen.

In a further preferred embodiment of the inventive domestic appliance, it can also be integrated into a home network and operated, and/or the operation monitored, therewith.

In these cases, the control device of the domestic appliance has an interface for the external communication of data.

In a further preferred embodiment, the domestic appliance contains a light sensor for the brightness in the siting area and the control device is configured to control a brightness of the touch screen depending upon the measured brightness in the siting area. Light sensors serve, in general, to detect an ambient brightness in the form of a light value $L_U$. In a further preferred embodiment of the inventive water-using domestic appliance, a light sensor is therefore additionally integrated into the domestic appliance. The light sensor is herein not restricted according to the invention, provided it can detect the brightness of the surroundings of the domestic appliance. The light sensor is herein connected to the control device which, on a decrease in the ambient brightness, preferably increases the brightness of the touch screen, and on an increase of the ambient brightness, reduces the brightness of the touch screen. For this purpose, a comparison between a light value $L_{soll}$ and the ambient light value $L_U$ is preferably made by the control device. Thus an operation of the touch screen that is pleasant for the eye can be provided to a user even at different ambient brightnesses, for example, at dark location sites and/or at dusk.

In general, it is preferred that touch screens do not always react to a touch by a user. It is thus, for example, desired that a smartphone which is transported in a pocket is touch-insensitive for this time. A similar principle applies, for example, for tablet computers. In this way, for example, a use by non-authorized users can also be prevented.

In a further preferred embodiment of the inventive domestic appliance, a domestic appliance is therefore preferred in which the control device is configured, following a time span $t_{Block}$ during which no touch signal generated by means of an external input unit has been registered, to block a use of the touch screen and to free it again only after a security input by a user. The security input is not restricted and comprises inputs, for example, wiping movements or the input of security codes in order to clear a lock screen. In this way, a domestic appliance can be made, for example, child-safe and/or, for example, an accidentally made input can be prevented. Preferably, however, a user can also choose whether a blocking of a touch screen operation on the inventive domestic appliance should be active or not.

A domestic appliance for treating objects is typically understood in the present context to be a device which is configured for treating household items, for example, laundry items, crockery/cutlery and foods. It can be a large domestic appliance, for example, a washing machine, a washer-dryer, a dishwasher, a cooking device, an extractor hood, a cooling appliance, a refrigeration-freezing combination or an air-conditioning appliance. However, it can also be a small domestic appliance, for example, a fully automatic coffee maker or a kitchen machine.

Particularly preferably, however, a water-using domestic appliance has numerous possibilities for the setting of control variables, so that for a user of the domestic appliance, its use can be complex. The touch screen provided in the inventive domestic appliance and its operation for controlling the domestic appliance then proves to be particularly advantageous.

Preferably, the domestic appliance is therefore a water-using domestic appliance selected from the group consisting of washing machine, washer-dryer, dryer and dishwasher. Particularly preferably, the domestic appliance is a washing machine or a washer-dryer.

A water-using domestic appliance generally has at least one sensor for determining a property that is important for the operation of the domestic appliance. If the domestic appliance is, for example, a washing machine, then suitable sensors could determine the type and quantity of the load of laundry and its degree of soiling. In the case of a washer-dryer, apart from the type and quantity of the load, the sensors can also determine, for example, the dampness of the laundry. On the basis of such data, the control device could evaluate particular approaches and this evaluation could then be used in the operation of the domestic appliance by means of the touch screen. For example, the control device could block the input of a problematic parameter value or problematic combinations of parameter values in order, for example, to prevent damage to delicate laundry items.

Further subject matter of the invention is a method for operating a domestic appliance for treating objects, comprising a control device and an operating device constructed as an external or internal touch screen, the control device being configured to display a display field on at least a part of the touch screen within a screen display, in which at least one operating element and at least one display element for setting and displaying a control variable of the domestic appliance settable by touch are arranged, wherein (a) the at least one operating element contains an elongate, flat sensor element with a first segment and at least two further segments, wherein associated with the first segment is a lowest value of the settable control variable or an OFF function for deactivating the control variable and different values of the settable control variable are associated respectively with the at least two further segments; and b) the control device is configured to display at least two display elements after and/or simultaneously with a touching of the sensor element, the first display element displaying the lowest settable value of the control variable or the OFF function and the second display element displaying the highest settable value of the control variable, and wherein between the first segment and the further segments, a larger spacing exists than between the further segments comprising the steps:

(i) display of a display field within a screen display; in the display field, an elongate, flat sensor element with a first segment and at least two further segments being arranged as at least one operating element, a lowest value of the settable control variable or an OFF function for deactivating the control variable being associated with the first segment and different values of the settable control variable being associated respectively with the at least two further segments;

(ii) following and/or simultaneously with a touching of the sensor element, display of at least two display elements for the display of a control variable of the domestic appliance which is settable by touch, the first display element displaying the lowest settable value of the control variable or the OFF function and the second display element displaying the highest settable value of the control variable;

(iii) modification of the settable control variable according to a touching of the sensor element; and (iv) carrying out a treatment program with the modified control variable.

The invention has numerous advantages. With the inventive configuration of the touch screen, the operation of a domestic appliance for treating objects and, in particular, such a water-using domestic appliance can be configured as more intuitive, and clearer for a user.

The inventive domestic appliance not only makes available to the user an improved possibility for communication with the domestic appliance for carrying out a treatment program, but also enables an improved information output, for example, in the form of text, image and/or animations. In particular, by means of a selective representation of information that is meaningful to a user at a particular operating time point and takes place precisely then, but also through a support of the visual perceptibility of important and unimportant information by the targeted emphasis or suppression of information through the manner of representation. In particular, an execution of the touch screen as an external touch screen also enables such a domestic appliance to be operated simply and in a mobile manner, for example, from outside the home.

BRIEF DESCRIPTION OF THE SEVERAL VIEWS OF THE DRAWING

Further details of the invention are disclosed in the following description of non-restrictive embodiments. Reference will be made to FIGS. 1 to 3.

DESCRIPTION OF THE INVENTION

Figure 1:
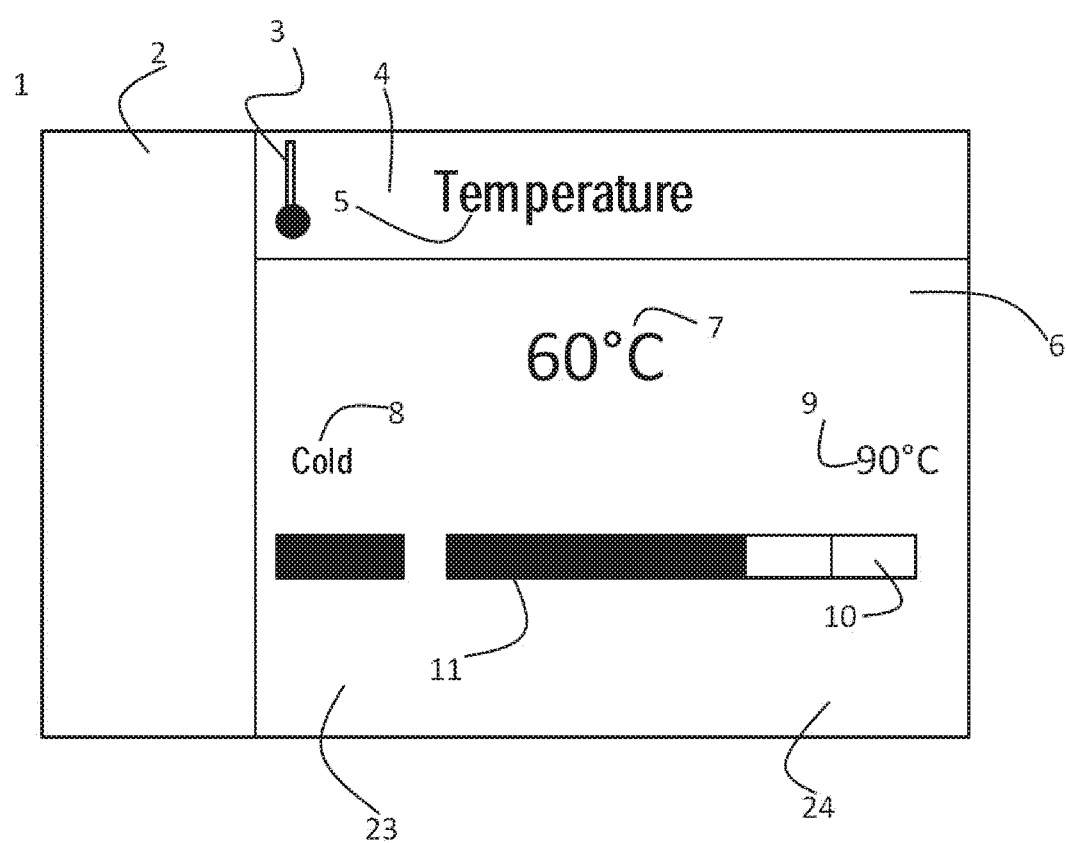

FIG. 1 shows a touch screen 1 of a non-restricting embodiment of an inventive domestic appliance which, in this embodiment, is configured as a washing machine. In touch screen 1 in FIG. 1, the whole surface zone of the touch screen 1 is touch-sensitive. Furthermore, the touch screen 1 corresponds here to a screen view, that is, the whole view for a user. The touch screen 1 has three display fields 2, 4 and 6, which subdivide the touch screen into three differently sized parts. The display field 2 is here configured only as an edge region, although it can also represent information, for example, in relation to a higher-level treatment program previously selected by a user, in the form of display elements. The display field 4 has a display element image of a thermometer 3 and an operating element text "Temperature" 5. By means of the operating element 5, a user can open the display field 6 to set the control variable Temperature and, following setting, close it again. It is possible, however, that by touching an upstream screen display (not shown here), the downstream screen display designated touch screen 1 here and thus simultaneously the display field 6 can be opened. In such a variant, therefore, the display fields 4 and 6 would be opened simultaneously. Finally, it would also be possible that only the display field 6 is opened for the modification of a control variable.

Furthermore, the display element 3 and the operating element 5 also serve to inform the user by means of the control variable to be set, in this case, the program parameter Temperature. The display field 6 has three display elements 7, 8, 9 and an operating element 10. The operating element 10 is an elongate, flat sensor element made here of seven segments 23, 24, each signal being associated with a particular temperature value for its setting and, in particular, the first segment 23 is shown delimited and the lowest settable value of the temperature scale is associated with this segment. The first segment 23 thus has a recognizable separation from the second and further segments 24. In this embodiment, the black region 11 shows a user the setting generated by touching, in this case 60° C. The display element 7, the text "60° C." provides to a user information regarding the set temperature. The display element 7 is herein displayed enlarged in order to enable better clarity. The display elements 8 and 9, the text "Cold" and the text "90° C. provide information to a user regarding the lowest value, in this case cold, and the highest value of the temperature value scale. Preferably, the display elements 8 and 9 are shown simultaneously with or directly following a first touch of the sensor element 10. In this way, the complexity of the representation can initially be kept clearer, since for a particular operating time point, relevant information, in this case the region of the temperature value scale, is only displayed if it is important to a user.

Figure 2:
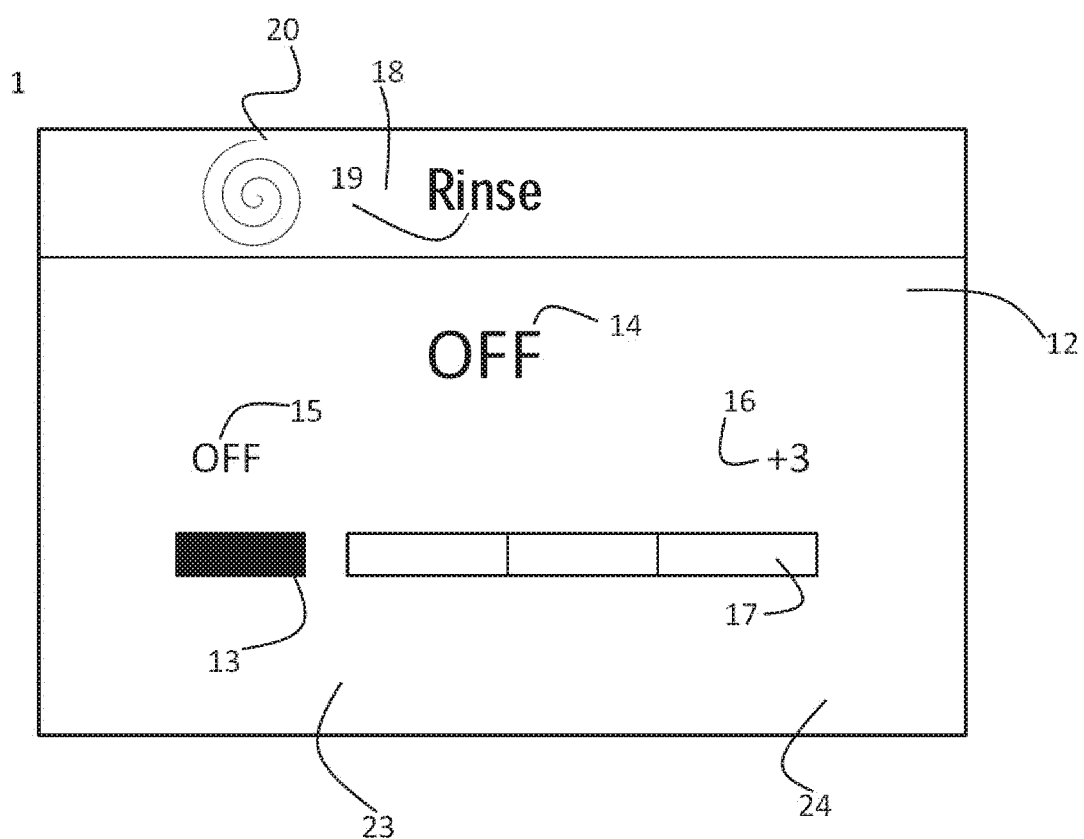

FIG. 2 shows a touch screen 1 as it is used in a second embodiment of an inventive domestic appliance. The touch screen 1 which here also corresponds to a screen view, has two display fields 12 and 18 in this embodiment which subdivide the touch screen into two different sized parts. The display field 18 has the display element image of a spiral 20 and the operating element text "Rinse" 19, which fulfil the same functions as described above in relation to FIG. 1. By means of the operating element 19, a user can open the display field 12 to set the additional option Rinse and, following setting, close it again. Furthermore, the display element 20 and the operating element 19 also serve for the information of the user by means of the settable control variable, in this case, the program parameter Rinse. The display field 12 has three display elements 14, 15 and 16, as well as an operating element 17. The operating element 17 is configured as an elongate, flat sensor element with four segments. By means of a touch, the user can thus select an additional rinsing process by means of the operating element 17 or can switch off this additional option. For this purpose, in particular, the first segment 23 is represented delimited, i.e. with a separation, from the further segments 24 and the function OFF is associated with it as an indication of the deactivation of the control variable Rinse, which in this embodiment comprises OFF and three additional rinsing processes. The black region 13 herein denotes the setting OFF made by a user, which is also shown by the display element text "OFF" 14. The display elements 15 and 16, text "OFF" and text "+3" display, in particular, the deactivation state and the highest value of the value scale Rinse. However, these display elements are preferably shown simultaneously with, or directly following, a first touch of the operating element 17.

Figure 3:
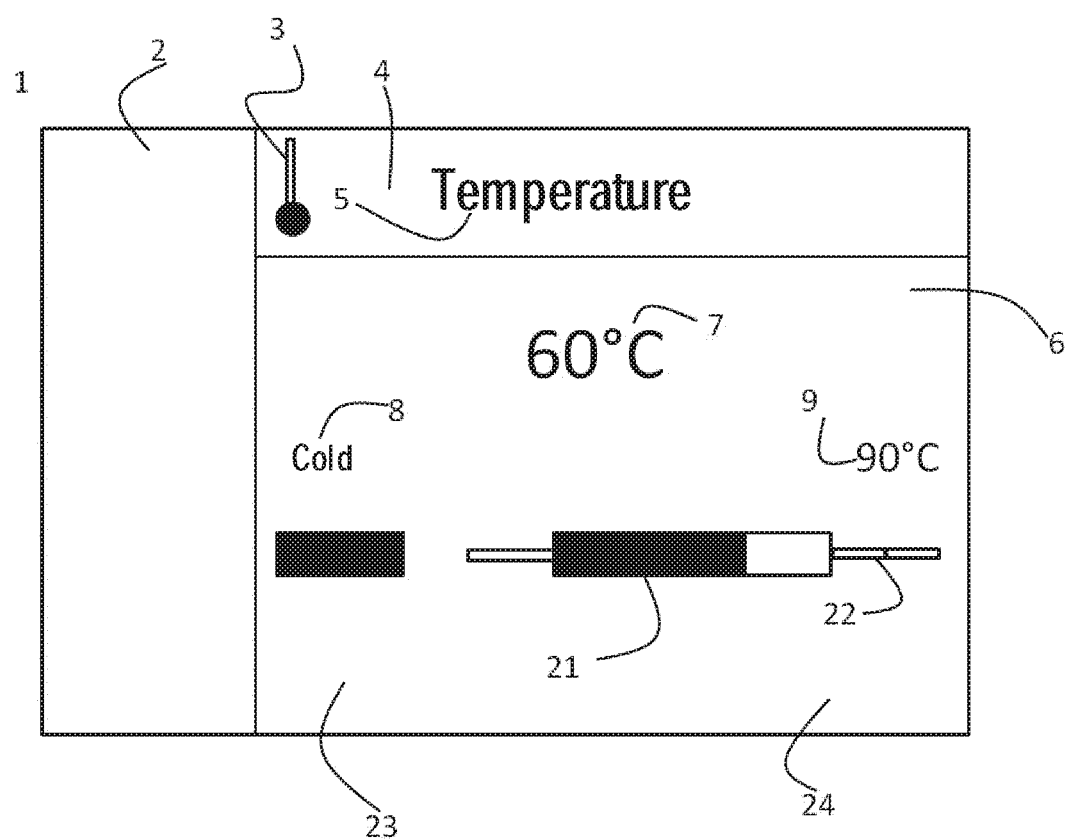

FIG. 3 shows a touch screen 1 as it is used in a third embodiment of an inventive domestic appliance. In this embodiment, the touch screen 1 again has three display fields 2, 4 and 6. As described in relation to FIG. 1, the display field 4 has a display element image of a thermometer 3 and an operating element text "Temperature" 5. By means of the operating element 5, a user can open the display field 6 to set the control variable Temperature and, following setting, close it again. Furthermore, the display element 3 and the operating element 5 also serve to inform the user by means of the control variable to be set, in this case, the program parameter Temperature. The display field 6 again has three display elements 6, 7, 8 and the operating element 22. The operating element 22 is also configured as an elongate, flat sensor element of seven segments. Of these seven segments, however, only four can be set by a user and the setting of the other three is blocked by the control device. Thus the three blocked segments have a lower validity G2 for a user than the settable four segments, which have the validity G1. Accordingly, in this embodiment, the segments with a lower validity are represented with a changed form, in this case, reduced in height, so that for a user, the blocking of the setting is visually easy to detect. The black region 21 denotes here also the setting made by the user, which is further indicated by the display element text "60° C." 7. The two display elements text "Cold" 8 and text "90° C." 9 accordingly again show the lowest and highest value of the value scale Temperature, the lowest value being associated with the first segment 23 of the operating element 22, which is displayed spaced from the remaining segments 24.

REFERENCE CHARACTERS

1 Touch screen
2 Display field
3 Display element image Thermometer
4 Display field
5 Operating element text "Temperature"
6 Display field
7 Display element text "60° C."
8 Display element text "Cold"
9 Display element text "90° C."
10 Elongate, flat sensor element
11 Generated set region
12 Display field
13 Generated set region
14 Display element text "OFF"
15 Display element text "OFF"
16 Display element text "+3"
17 Elongate, flat sensor element
18 Display field
19 Operating element text "Rinse"
20 Display element image spiral
21 Generated set region
22 Elongate, flat sensor element with partially blocked input
23 First segment
24 Further segments; second and further segments

The invention claimed is:

1. A domestic appliance for treating objects, the domestic appliance comprising:
   a) a control device and an operating device constructed as an external or internal touch screen, said control device being configured to display a display field on at least a part of said touch screen within a screen display, said display field containing at least one operating element and at least one display element for setting and displaying a control variable of the domestic appliance being settable by a touch;
   b) said at least one operating element containing an elongate, flat sensor element with a first segment and at least two further segments, a lowest value of said settable control variable or an OFF function for deactivating said control variable being associated with said first segment and different values of said settable control variable being associated with each of said at least two further segments;
   c) said control device being configured to display at least first and second display elements, at least one of after or simultaneously with a touching of said sensor element, said first display element displaying said lowest settable value of said control variable or said OFF function and said second display element displaying a highest settable value of said control variable; and
   d) said at least two further segments defining a spacing therebetween, and said first segment and said at least two further segments being separated from each other and defining a spacing therebetween being larger than said spacing between at least two further segments.

2. The domestic appliance according to claim 1, wherein said sensor element is a capacitive sensor element.

3. The domestic appliance according to claim 1, wherein said operating device is constructed as an external touch screen.

4. The domestic appliance according to claim 3, wherein said external touch screen is a tablet computer or smartphone configured for controlling the domestic appliance.

5. The domestic appliance according to claim 1, which further comprises a sound generator and a loudspeaker for generating and reproducing acoustic signals in relation to setting said control variables.

6. The domestic appliance according to claim 1, which further comprises a light sensor for sensing a brightness in an installation area, said control device being configured to control a brightness of said touch screen depending upon a measured brightness in the installation area.

7. The domestic appliance according to claim 1, wherein said control device is configured to block a use of said touch screen following a time span ($t_{Block}$) during which no touch signal generated by an external input unit has been registered and to free said touch screen again only after a security input by a user.

8. The domestic appliance according to claim 1, wherein the domestic appliance is a water-using domestic appliance selected from the group consisting of a washing machine, a washer-dryer, a dryer and a dishwasher.

9. The domestic appliance according to claim 1, wherein the domestic appliance is a washing machine or a washer-dryer.

10. The domestic appliance according to claim 1, wherein said control device is configured to at least one of display operating elements or display elements with a higher validity emphasized with at least one of color or high contrast and to display the at least one of operating elements or the display elements with a lower validity having at least one of a suppressed color, a lower contrast or a different form.

11. The domestic appliance according to claim 1, wherein said settable control variables include at least one of treatment programs, program parameters or additional options.

12. The domestic appliance according to claim 1, wherein said control device stores dependencies for said settable control variables and said control device is configured to block at least one of a disadvantageous or damage-causing setting of said control variables based upon said dependencies.

13. The domestic appliance according to claim 1, wherein said control device is configured to enable a direct start of a treatment program by touching a sub region of an operating element.

14. The domestic appliance according to claim 1, wherein said control device is configured to enable a change between one screen display and another screen display by touching a sub region of an operating element.

15. A method for operating a domestic appliance for treating objects, the method comprising the following steps:
   i) providing a control device and an operating device constructed as an external or internal touch screen, the control device being configured to display a display field on at least a part of the touch screen and to display at least one operating element and at least first and second display elements on the display field, the at least one operating element being used to set a settable control variable of the domestic appliance by a touch, the at least one operating element being an elongate flat sensor element including at least three segments, the settable control variable including a value scale with at least three values, the value scale having a respective value being associated with each segment for setting a value by touching an external input unit, the sellable control variable changing continuously or in jumps, at least one of a lower settable value or an OFF function being associated with a first segment, the control device being configured to display at least the first and second display elements, at least one of following or simultaneously with a first touch of the sensor element, the first display element displaying at least one of a lowest settable value of the value scale or the OFF function, and the second display element displaying a highest settable value of the value scale;
   ii) providing a spacing between at least two further segments, and providing a spacing between the first segment and the at least two further segments being larger than the spacing between the at least two further segments;
   iii) displaying a display field within a screen display, locating the elongate, flat sensor element with the first segment and the at least two further segments in the display field as at least one operating element, associating the lowest value of the settable control variable or the OFF function for deactivating the control variable with the first segment and respectively associating different values of the settable control variable with the at least two further segments;
   iv) displaying at least first and second display elements for the display of a control variable of the domestic appliance to be set by touch at least one of following or simultaneously with a touching of the sensor element, displaying the lowest settable value of the control variable or the OFF function with the first display element, and displaying the highest settable value of the control variable with the second display element;

v) modifying the sellable control variable corresponding to touching the sensor element; and vi) carrying out a treatment program with the modified control variable.

\* \* \* \* \*